United States Patent
Jin et al.

(10) Patent No.: US 11,590,536 B2
(45) Date of Patent: Feb. 28, 2023

(54) WAFER LEVEL ULTRASONIC CHIP MODULE AND MANUFACTURING METHOD THEREOF

(71) Applicants: SONICMEMS (ZHENGZHOU) TECHNOLOGY CO., LTD., Zhengzhou (CN); PEKING UNIVERSITY SHENZHEN GRADUATE SCHOOL, Shenzhen (CN)

(72) Inventors: Yu-Feng Jin, Shenzhen (CN); Sheng-Lin Ma, Shenzhen (CN); Qian-Cheng Zhao, Shenzhen (CN); Yi-Hsiang Chiu, Taipei (TW); Huan Liu, Shenzhen (CN); Hung-Ping Lee, Taipei (TW); Dan Gong, Shenzhen (CN)

(73) Assignees: PEKING UNIVERSITY SHENZHEN GRADUATE SCHOOL, Shenzhen (CN); SONICMEMS (ZHENGZHOU) TECHNOLOGY CO., LTD., Zhengzhou (CN)

( * ) Notice: Subject to any disclaimer, the term of this patent is extended or adjusted under 35 U.S.C. 154(b) by 954 days.

(21) Appl. No.: 16/274,477

(22) Filed: Feb. 13, 2019

(65) Prior Publication Data
US 2020/0179979 A1 Jun. 11, 2020

(30) Foreign Application Priority Data
Dec. 7, 2018 (CN) .......................... 201811491104.1

(51) Int. Cl.
*B06B 3/00* (2006.01)
*B06B 1/06* (2006.01)
(Continued)

(52) U.S. Cl.
CPC .............. *B06B 3/00* (2013.01); *B06B 1/0662* (2013.01); *G06V 40/1306* (2022.01);
(Continued)

(58) Field of Classification Search
CPC ...... B06B 3/00; B06B 1/0662; G06K 9/0002; H01L 41/277; H01L 41/332;
(Continued)

(56) References Cited

U.S. PATENT DOCUMENTS

2018/0154635 A1* 6/2018 Nakakubo .............. B41J 2/1639
2018/0197661 A1* 7/2018 Seitz ...................... B23K 1/008

* cited by examiner

*Primary Examiner* — Shawki S Ismail
*Assistant Examiner* — Monica Mata
(74) *Attorney, Agent, or Firm* — Muncy, Geissler, Olds & Lowe, P.C.

(57) ABSTRACT

A wafer level ultrasonic chip module includes a substrate, a composite layer, a conducting material, and a base material. The substrate has a through slot that passes through an upper surface of the substrate and a lower surface of the substrate. The composite layer includes an ultrasonic body and a protective layer. A lower surface of the ultrasonic body is exposed from the through slot. The protective layer covers the ultrasonic body and a partial upper surface of the substrate. The protective layer has an opening, from which a partial upper surface of the ultrasonic body is exposed. The conducting material is in contact with the upper surface of the ultrasonic body. The base material covers the through slot, such that a space is formed among the through slot, the lower surface of the ultrasonic body and an upper surface of the base material.

7 Claims, 12 Drawing Sheets

(51) Int. Cl.

| | |
|---|---|
| *H01L 41/083* | (2006.01) |
| *H01L 41/08* | (2006.01) |
| *H01L 41/277* | (2013.01) |
| *H01L 41/332* | (2013.01) |
| *H01L 41/337* | (2013.01) |
| *H01L 41/338* | (2013.01) |
| *G06K 9/00* | (2022.01) |
| *G06V 40/13* | (2022.01) |

(52) U.S. Cl.
CPC ...... *H01L 41/0825* (2013.01); *H01L 41/0831* (2013.01); *H01L 41/277* (2013.01); *H01L 41/332* (2013.01); *H01L 41/337* (2013.01); *H01L 41/338* (2013.01)

(58) Field of Classification Search
CPC . H01L 41/337; H01L 41/338; H01L 41/0825; H01L 41/0831
USPC ......................................................... 310/334
See application file for complete search history.

WAFER LEVEL ULTRASONIC CHIP MODULE AND MANUFACTURING METHOD THEREOF

CROSS-REFERENCE TO RELATED APPLICATION

This non-provisional application claims priority under 35 U.S.C. § 119(a) to Patent Application No. 201811491104.1 filed in China, P.R.C. on Dec. 7, 2018, the entire contents of which are hereby incorporated by reference.

BACKGROUND

Technical Field

The present invention relates to an ultrasonic transmission technology, and in particular, to a wafer level ultrasonic chip module and a manufacturing method thereof.

Related Art

With the development of technologies, smart electronic devices such as mobile phones, personal laptops or tablets have become essential tools in life. The public has become accustomed to storing important information or personal data inside smart electronic devices. The functions or applications of these smart electronic devices are also becoming more and more personalized. To avoid the situations such as loss or misappropriation of important information, smart electronic devices have been widely used in fingerprint recognition to identify their users.

At present, an ultrasonic fingerprint recognition technology has been applied to smart electronic devices. Generally, when an ultrasonic module is integrated into a smart electronic device, a finger touches an upper cover of the ultrasonic module or a screen protection layer of the smart electronic device, and the ultrasonic module sends an ultrasonic signal to the finger and is capable of recognizing a fingerprint by receiving the intensity of the ultrasonic signal reflected back from peaks and troughs of the fingerprint. However, the ultrasonic signal of the ultrasonic module can be transmitted to an area not in contact with the finger by means of a medium. Thus, the reflected ultrasonic signal received by the ultrasonic module is not necessarily reflected by the finger, so that the fingerprint is less likely to be recognized, and the accuracy of fingerprint recognition is low.

SUMMARY

An embodiment of the present invention provides a wafer level ultrasonic chip module, which includes a substrate, a composite layer, a conducting material, and a base material. The substrate has a through slot, which passes through an upper surface of the substrate and a lower surface of the substrate. The composite layer is located on the substrate. The composite layer includes an ultrasonic body and a protective layer. The ultrasonic body is located on the upper surface of the substrate, and a lower surface of the ultrasonic body is exposed from the through slot. The protective layer covers the ultrasonic body and a partial upper surface of the substrate. The protective layer has an opening, from which a partial upper surface of the ultrasonic body is exposed. The conducting material is located in the opening and is in contact with the upper surface of the ultrasonic body. The base material is located on the lower surface of the substrate and covers the through slot, such that a space is formed among the through slot, the lower surface of the ultrasonic body and an upper surface of the base material.

The present invention provides a manufacturing method of a wafer level ultrasonic chip module. The method includes: forming an ultrasonic body on a substrate; forming a first protective material layer on an upper surface of the ultrasonic body and an upper surface of the substrate; patterning the first protective material layer to form a first protective layer; forming a conductive material layer on two circuit predetermined areas to form two electrode circuits; forming a second protective layer to cover the two electrode circuits; removing a partial second protective layer from an upper surface of the second protective layer to expose a partial upper surface of the ultrasonic body so as to form an opening; covering a carrier plate to shield the upper surface of the second protective layer and the opening; removing a partial substrate corresponding to the ultrasonic body from a lower surface of the substrate to the upper surface of the substrate so as to expose a lower surface of the ultrasonic body; forming a base material on the lower surface of the substrate, such that a space is formed between the lower surface of the ultrasonic body and an upper surface of the base material; removing the carrier plate; and filling a conducting material in the opening. In an embodiment, the ultrasonic body includes a first electrode and a second electrode not connected with the first electrode. The first protective layer has two circuit predetermined areas, where the two circuit predetermined areas expose a partial upper surface of the first electrode and a partial upper surface of the second electrode respectively.

In summary, an embodiment of the present invention provides a wafer level ultrasonic chip module and a manufacturing method thereof. A conducting material is disposed in an opening of a protective layer, and since an ultrasonic signal can be better transmitted to a finger by means of the conducting material, the accuracy of fingerprint recognition can be improved.

DETAILED DESCRIPTION

Figure 1:
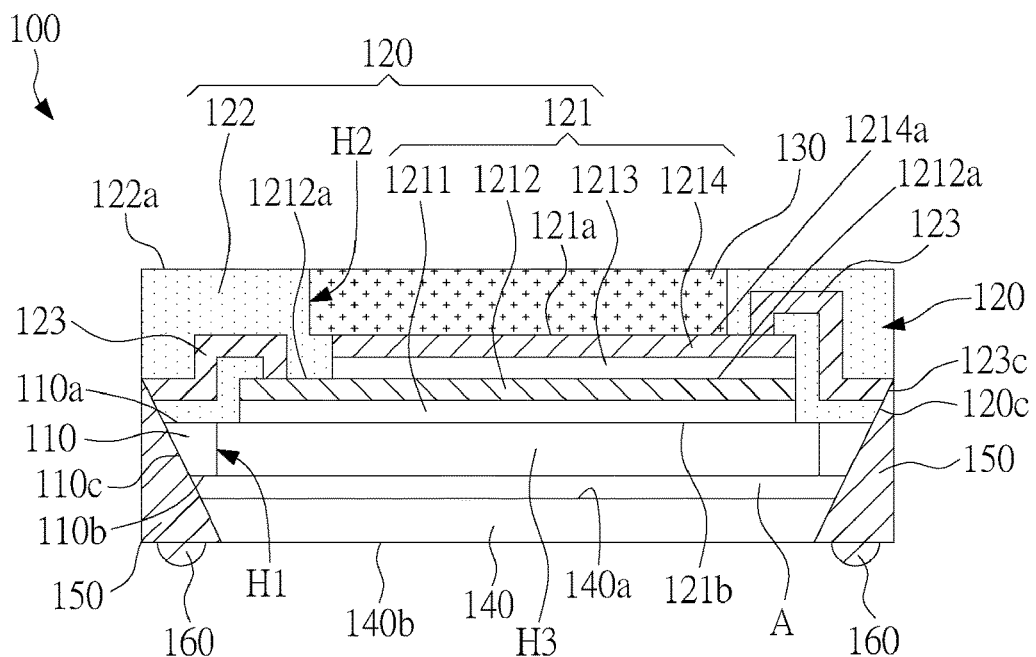
FIG. 1 is a schematic structural diagram of a wafer level ultrasonic chip module according to an embodiment of the present invention.

FIG. 1 is a schematic structural diagram of a wafer level ultrasonic chip module according to an embodiment of the present invention. Referring to FIG. 1, a wafer level ultrasonic chip module 100 includes a substrate 110, a composite layer 120, an utrasonic conducting material 130, and a base material 140. The composite layer 120 is located on an upper surface of the substrate 110, and the base material 140 is bonded to a lower surface of the substrate 110.

The substrate 110 has a through slot H1, and the through slot H1 passes through the upper surface 110a and the lower surface 110b of the substrate 110. The substrate 110 is used for carrying the composite layer 120. In an implementation, the substrate 110 may be, but is not limited to, a silicon substrate, a glass substrate, a sapphire substrate, a plastic substrate or the like.

The composite layer 120 is disposed on the substrate 110. The composite layer 120 includes an ultrasonic body 121 and a protective layer 122. The ultrasonic body 121 is located on the upper surface 110a of the substrate 110, and at least a portion of a lower surface 121b of the ultrasonic body 121 is exposed from the through slot H1. The ultrasonic body 121 corresponds to the through slot H1, and in other words, the ultrasonic body 121 is located on the through slot H1. The projection of the ultrasonic body 121 and the projection of the through slot H1 overlap in a vertical projection direction of the substrate 110. The protective layer 122 covers the ultrasonic body 121 and a partial upper surface 110a of the substrate 110. The protective layer 122 has an opening H2, the opening H2 extends from an upper surface 122a of the protective layer 122 to an upper surface 121a of the ultrasonic body 121, and a partial upper surface 121a of the ultrasonic body 121 is exposed. In an implementation, the material of the protective layer 122 is, for example but not limited to, silicon dioxide (PE-SiO2). The opening H2 and the through slot H1 are at opposite sides of the ultrasonic body 121. In detail, the opening H2 is at the upper side of the ultrasonic body 121, and the through slot H1 is at the lower side of the ultrasonic body 121.

The ultrasonic conducting material 130 is located in the opening H2 and is in contact with the upper surface 121a of the ultrasonic body 121. In an implementation, the ultrasonic conducting material 130 may be polydimethylsiloxane (PDMS). An ultrasonic signal generated by the ultrasonic body 121 may be better transmitted to a finger by means of the ultrasonic conducting material 130.

The base material 140 is located on the lower surface 110b of the substrate 110 and covers the through slot H1, such that a space H3 is formed among the through slot H1, the lower surface 121b of the ultrasonic body 121 and an upper surface 140a of the base material 140. In an implementation, the base material 140 may be disposed on the lower surface 110b of the substrate 110 through an adhesive material A. In an implementation, the adhesive material A may be a double-sided adhesive tape, viscous ink or viscous paint. Hereupon, the ultrasonic body 121 is suspended over the space H3, such that the ultrasonic body 121 is easily oscillated. In other words, the projection of the ultrasonic body 121 and the projection of the space H3 overlap in a vertical projection direction of the base material 140, and the lower surface 121b of the ultrasonic body 121 is not in contact with the upper surface 140a of the base material 140. In an implementation, the space H3 may be vacuum. Hereupon, the ultrasonic signal (second ultrasonic signal) transmitted from the ultrasonic body 121 is not easily conducted in the vacuum space H3 because there is no medium.

Accordingly, a first ultrasonic signal transmitted from the ultrasonic body 121 in the direction of the upper surface 121a of the ultrasonic body 121 is substantially transmitted via a solid medium (protective layer 122 and/or ultrasonic conducting material 130); and a second ultrasonic signal transmitted from the ultrasonic body 121 in the direction of the base material 140 is substantially transmitted via a solid medium and/or a vacuum space (base material 140 and space H3, etc.). That is to say, the first ultrasonic signal is transmitted via the same type of medium (solid medium), and the second ultrasonic signal need to be transmitted via the solid medium and the vacuum space. The second ultrasonic signal is not easily conducted in the vacuum space H3 because there is no medium, so that the speed of the first ultrasonic signal which is reflected and returned by a finger is different from the speed of the second ultrasonic signal which passes through air in the space H3 and is reflected and returned by the base material 140. Hereupon, an overall gap is designed such that the transmission speeds of the first ultrasonic signal and the second ultrasonic signal are different. In addition, since the ultrasonic signal can be better transmitted to the finger by means of the ultrasonic conducting material 130, the wafer level ultrasonic chip module according to this embodiment of the present invention can distinguish and filter the second ultrasonic signal while only receiving the first ultrasonic signal. Therefore, the fingerprint of the finger located on the upper surface of the protective layer 122 can be recognized by the first ultrasonic signal, and the interference of the second ultrasonic signal can be avoided, thus improving the accuracy of fingerprint recognition.

The ultrasonic body may have different embodiments. In an embodiment of the ultrasonic body, as shown in FIG. 1, the ultrasonic body 121 includes a first piezoelectric layer 1211, a first electrode 1212, a second piezoelectric layer 1213 and a second electrode 1214. The first piezoelectric layer 1211 is located on the substrate 110, the first electrode 1212 is located on the first piezoelectric layer 1211, the second piezoelectric layer 1213 is located on the first electrode 1212, and the second electrode 1214 is located on the second piezoelectric layer 1213. The second piezoelectric layer 1213 and the second electrode 1214 do not cover a partial upper surface 1212a of the first electrode 1212. That is to say, the partial upper surface 1212a of the first electrode 1212 is exposed from the second piezoelectric layer 1213 and the second electrode 1214. In an implementation, the materials of the first piezoelectric layer 1211 and the second piezoelectric layer 1213 are, for example but not limited to, piezoelectric materials such as aluminum nitride (AlN), zinc oxide (ZnO), or lead zirconate titanate (PZT). In an implementation, the materials of the first electrode 1212 and the second electrode 1214 are, for example but not limited to, conductive materials such as aluminum (Al), tungsten (W), molybdenum (Mo), platinum (Pt), and gold (Au).

Figure 2:
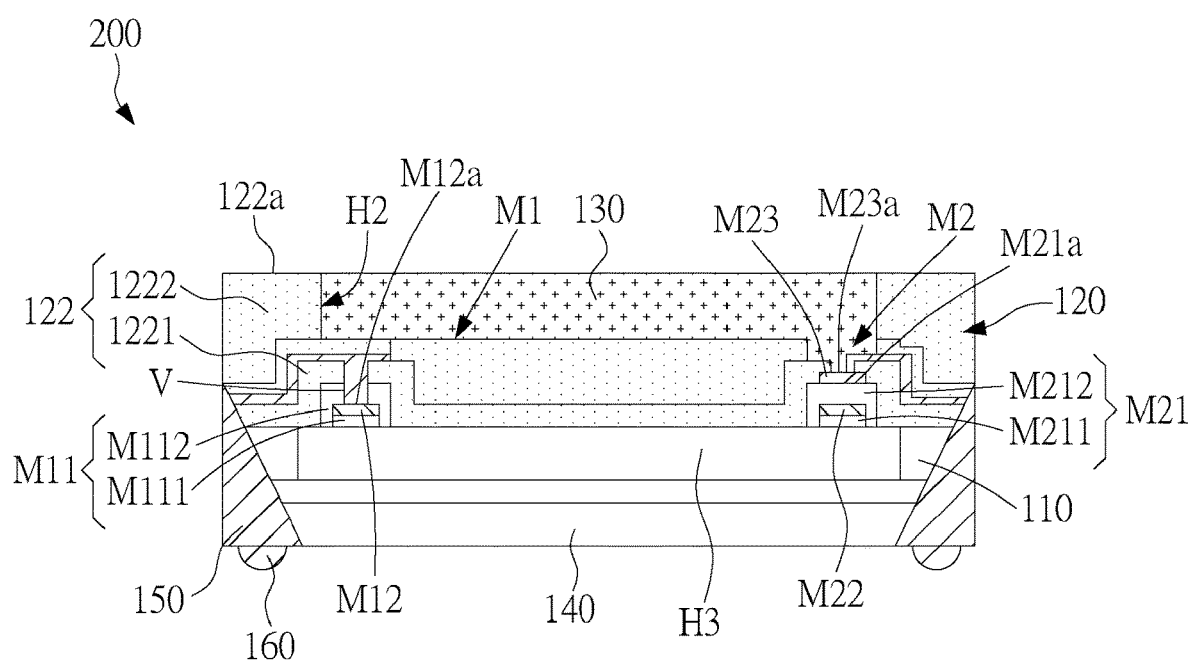
FIG. 2 is a schematic structural diagram of a wafer level ultrasonic chip module according to another embodiment of the present invention.

In another variant embodiment of the ultrasonic body, as shown in FIG. 2, an ultrasonic body 221 includes a first ultrasonic component M1 and a second ultrasonic component M2. The first ultrasonic component M1 and the second ultrasonic component M2 do not overlap in the direction perpendicular to the substrate 110. The first ultrasonic component M1 includes a first piezoelectric layer M11 and a first electrode M12. The first piezoelectric layer M11 is located on the substrate 110 and the first piezoelectric layer M11 has a contact hole V. The first electrode M12 is wrapped in the first piezoelectric layer M11 and the contact hole V exposes a partial upper surface M12a of the first electrode M12. The second ultrasonic component M2 includes a second piezoelectric layer M21, a second circuit M22 and a second electrode M23. The second piezoelectric layer M21 is located on the substrate 110. The second circuit M22 is wrapped in the second piezoelectric layer M21. The second electrode M23 is located on an upper surface M21a of the second piezoelectric layer M21. The first electrode M12 and the second circuit M22 are at the same layer but separated from each other. In other words, the ultrasonic conductive material is deposited through the same process and the partial ultrasonic conductive material layer is removed by etching to form the first electrode M12 and the second circuit M22 which are at the same layer but separated from each other. In addition, the opening H2 of the protective layer 122 exposes a partial upper surface M23a of the second electrode M23. The ultrasonic conducting material 130 is located in the opening H2 and is in contact with the partial upper surface M23a of the second electrode M23. In an implementation, as shown in FIG. 2, the opening H2 may further expose an electrode circuit 123 electrically connected to the first electrode M12 in addition to exposing the upper surface 221a of the ultrasonic body 221 and the second electrode M23. In another implementation (not shown), the opening H2 may expose only the second electrode M23 and the upper surface 221a of the ultrasonic body 221.

In an embodiment, as shown in FIG. 1 and FIG. 2, the composite layer 120 further includes two electrode circuits 123. The protective layer 122 wraps the two electrode circuits 123 and exposes a partial electrode circuits 123. Hereupon, the two electrode circuits 123 may be used for transmitting an electrical signal of the ultrasonic body 121 to the outside. In the present embodiment, as shown in FIG. 1 and FIG. 2, the protective layer 122 exposes side surfaces 123c of the two electrode circuits 123. The two electrode circuits 123 are respectively located on the partial upper surface (upper surface 1212a of FIG. 1 and upper surface M12a of FIG. 2) of the first electrode (first electrode 1212 of FIG. 1 and first electrode M12 of FIG. 2) and the partial upper surface (upper surface 1214a of FIG. 1 and upper surface M23a of FIG. 2) of the second electrode (second electrode 1214 of FIG. 1 and second electrode M23 of FIG. 2), and are electrically connected with the first electrode 1212 and the second electrode 1214, respectively. In an implementation, the composite layer 120 may further include a circuit (not shown) electrically connected between the ultrasonic body (ultrasonic body 121 and 221) and/or other electronic components, such as circuit wires and conductive pads according to the overall electrical connection requirement. In an implementation, the materials of the two electrode circuits 123 may be copper aluminide (AlCu).

In an embodiment, as shown in FIG. 1 and FIG. 2, the wafer level ultrasonic chip module 100 or 200 includes a conductor layer 150 and at least one pad 160. The conductor layer 150 is located on a side surface 120c of the composite layer 120. In an implementation, the conductor layer 150 may be further located on the side surface 120c of the composite layer 120 and extend to a lower surface 140b of the base material 140, and the conductor layer 150 is electrically connected with the side surface 123c of the electrode circuit 123 that is exposed from the protective layer 122. The pad 160 is located on the conductor layer 150. Hereupon, the two electrode circuits 123 may be electrically connected with the pad 160 by means of the conductor layer 150, so that components (such as the ultrasonic body 121 and/or other electronic components) may be electrically connected with external circuits. In an implementation, the pad 160 may be a solder ball or a bump.

Figure 3A:
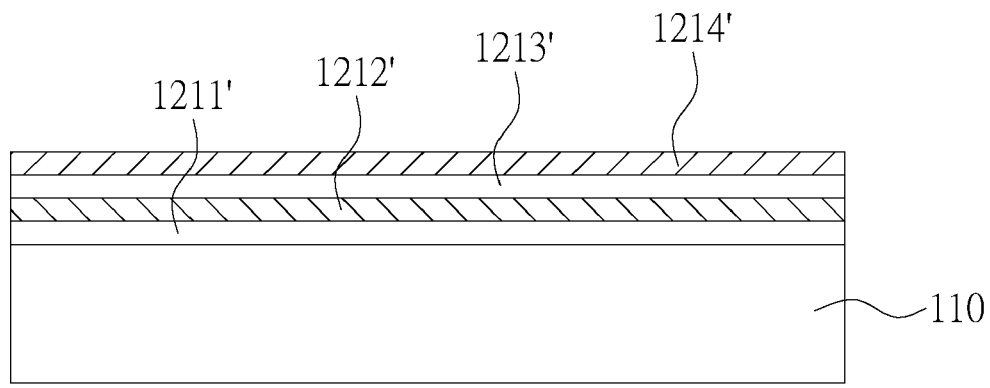
FIG. 3A to FIG. 3N are schematic diagrams formed at each step of a manufacturing method of a wafer level ultrasonic chip module according to an embodiment of the present invention respectively.
Figure 3B:
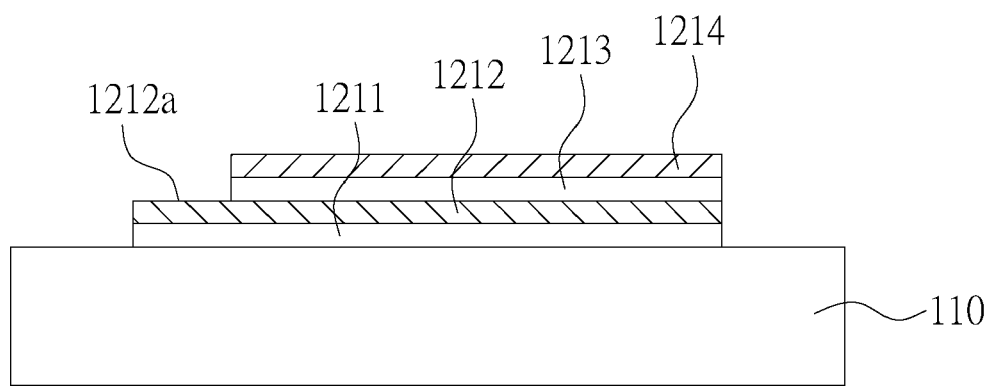
Figure 3C:
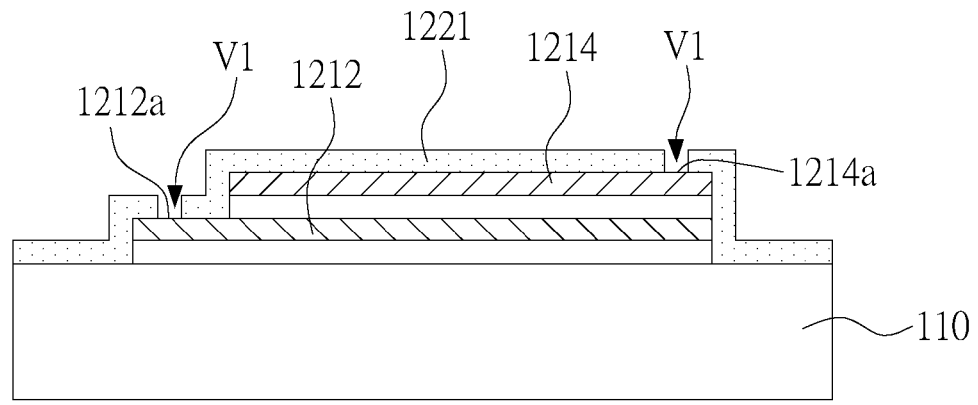
Figure 3D:
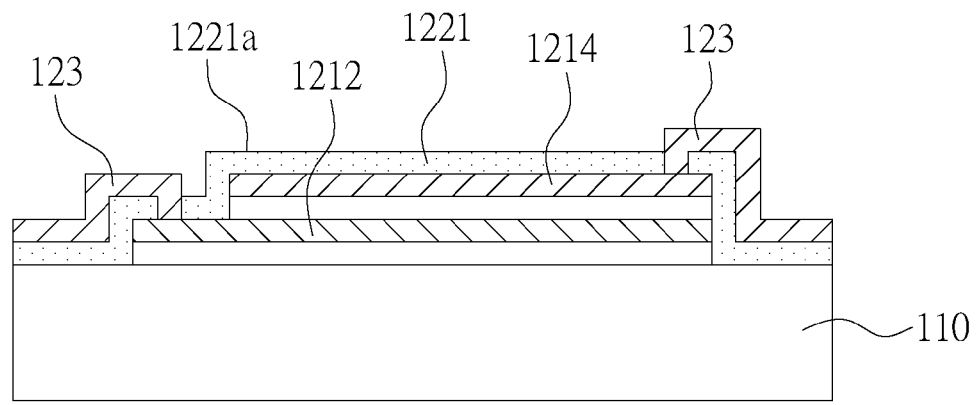
Figure 3E:
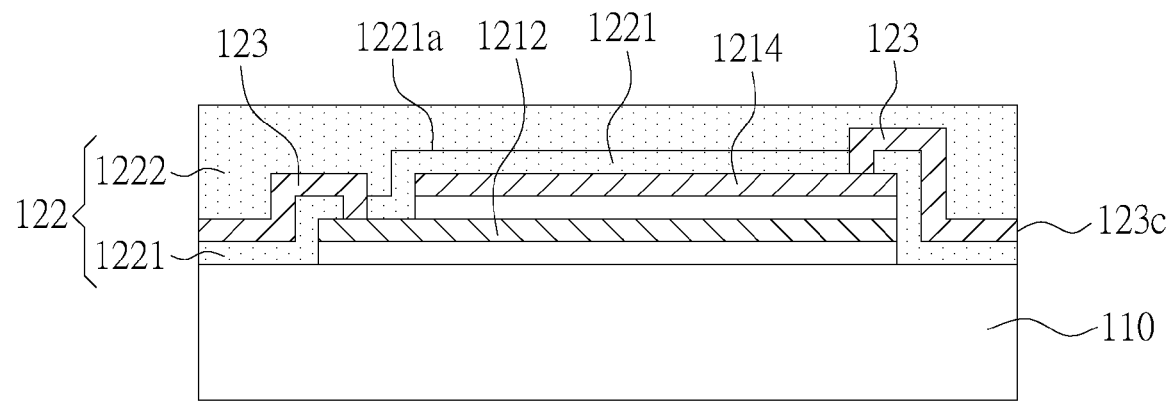
Figure 3F:
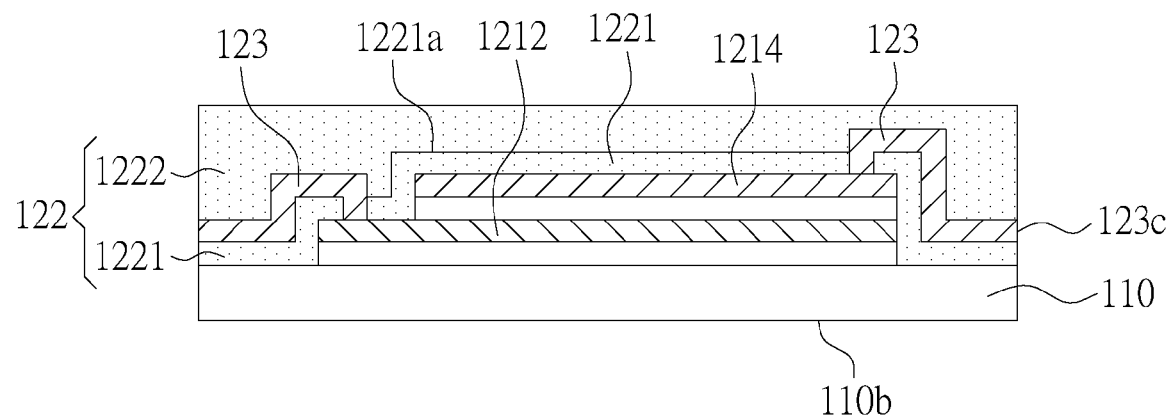
Figure 3G:
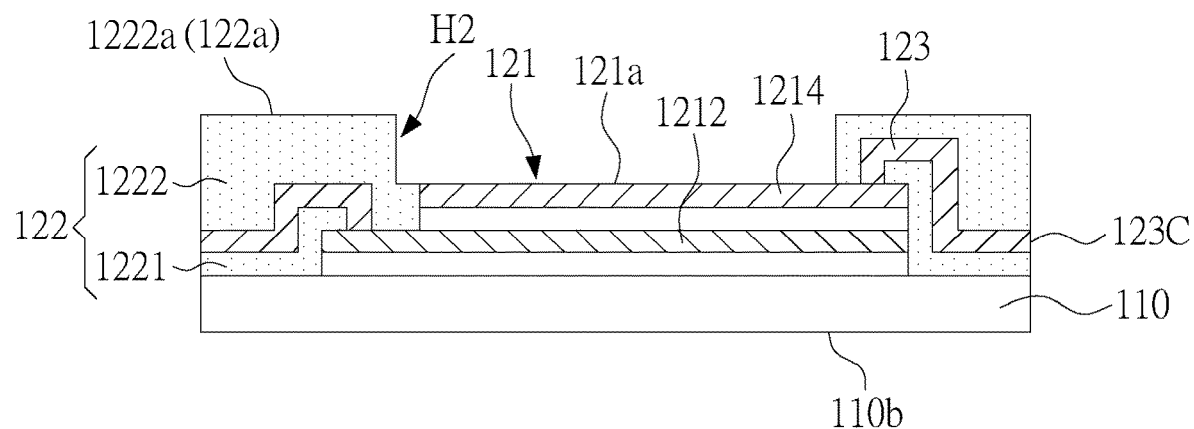
Figure 3H:
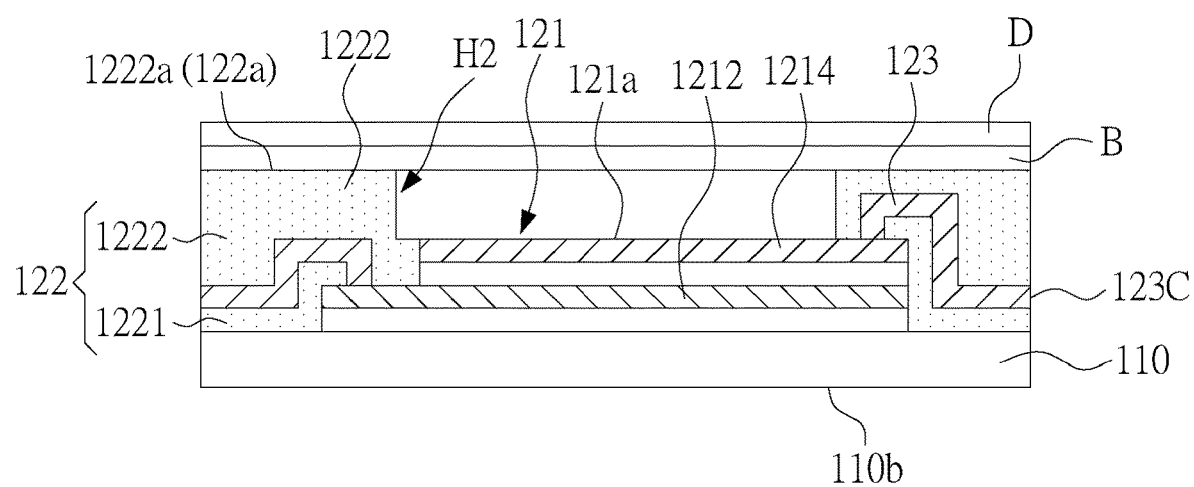
Figure 3I:
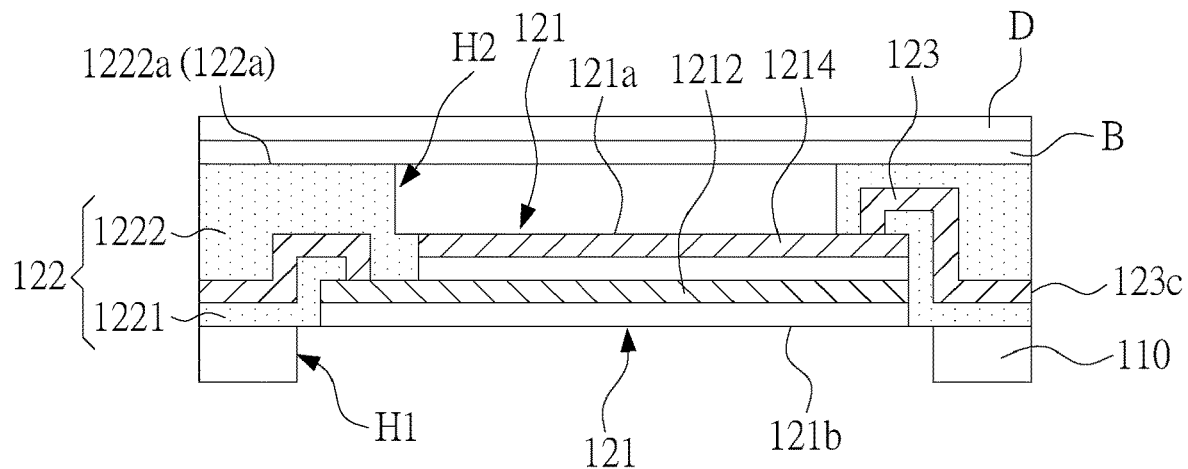
Figure 3J:
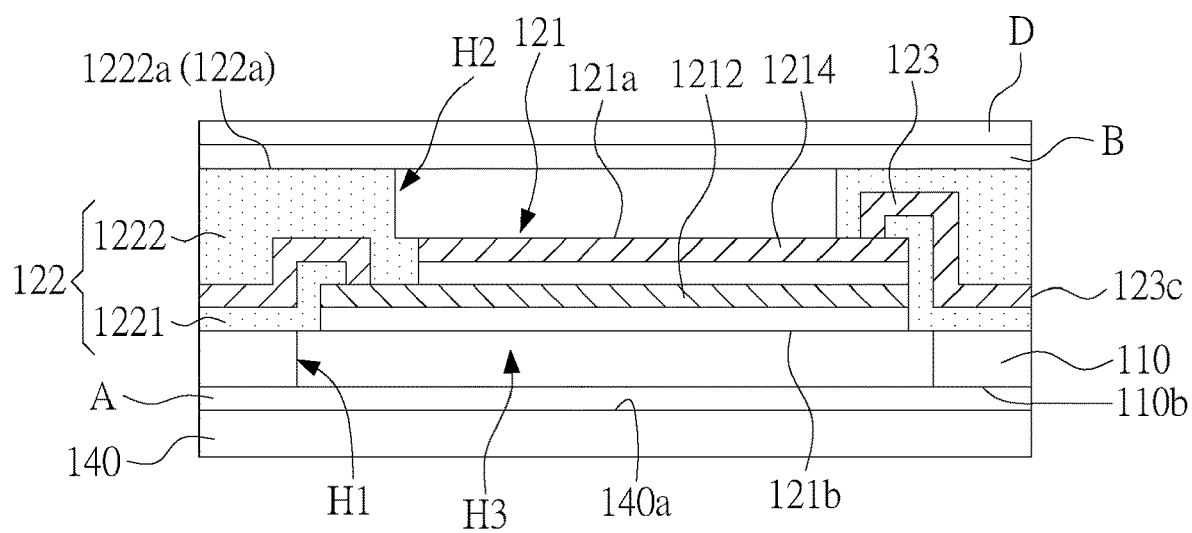
Figure 3K:
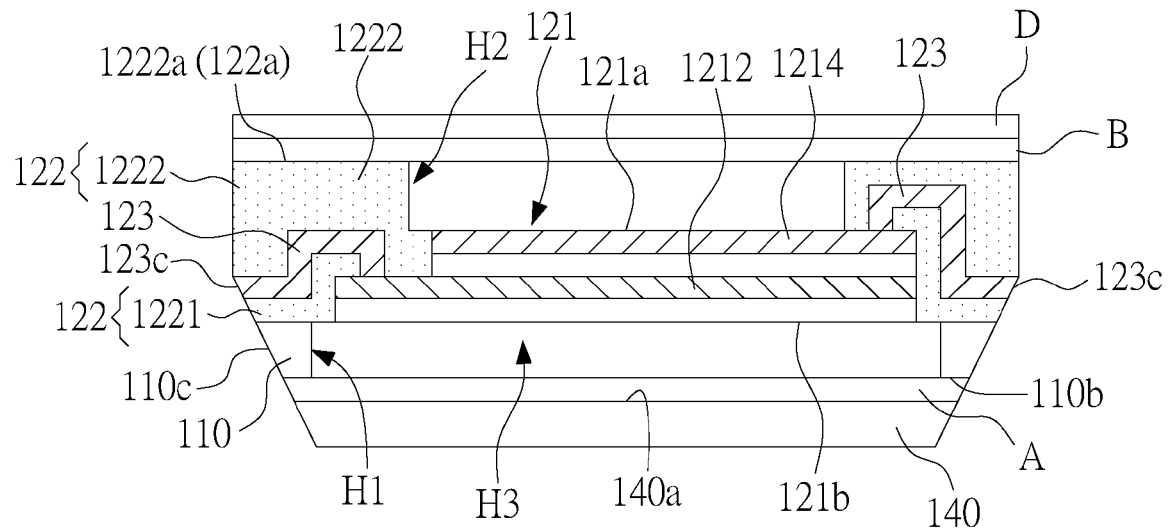
Figure 3L:
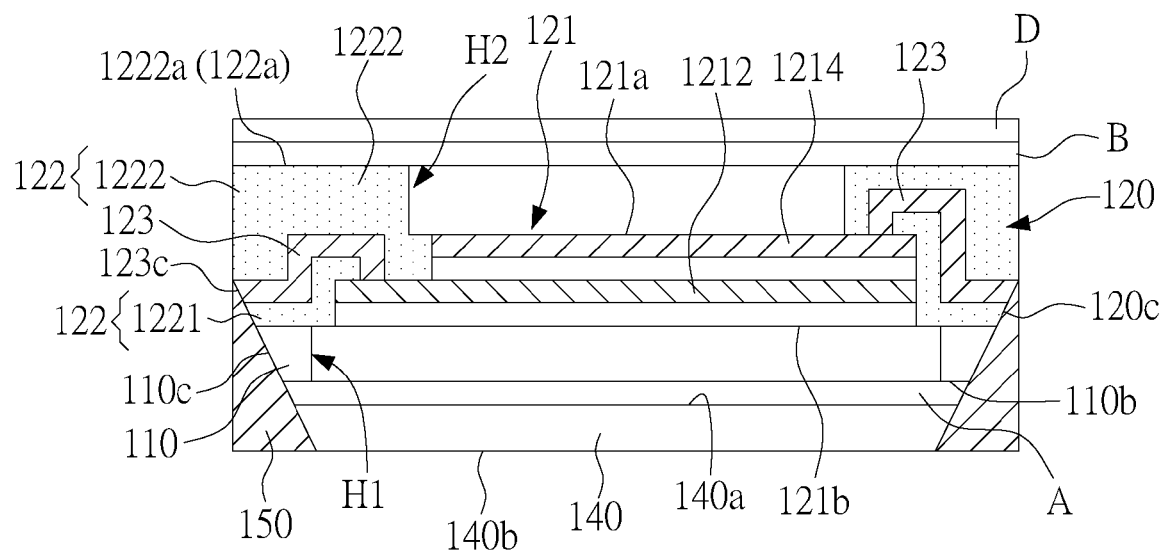
Figure 3M:
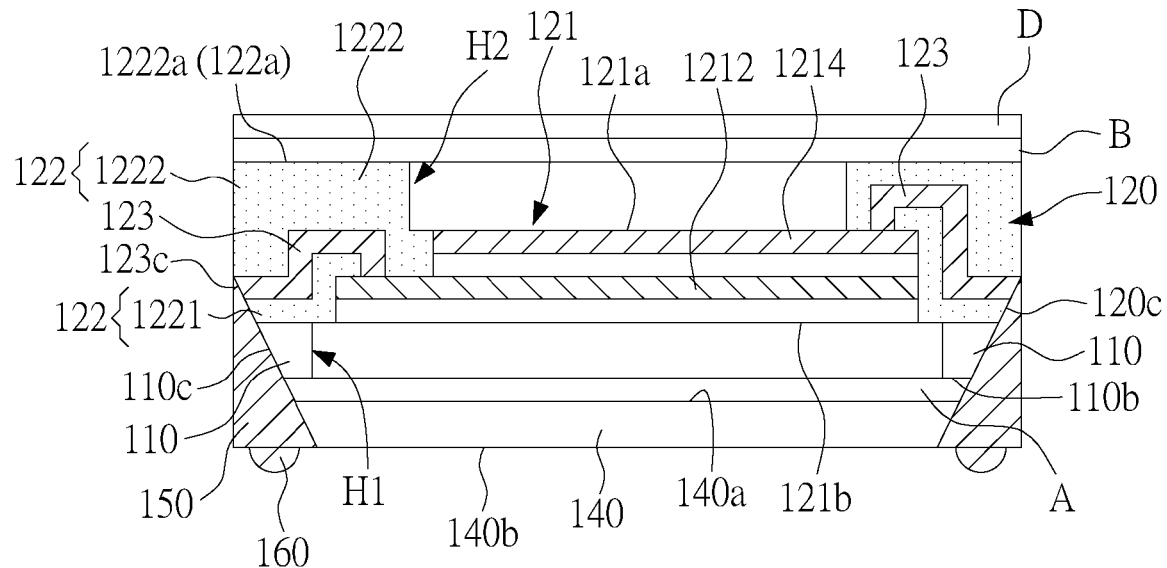
Figure 3N:
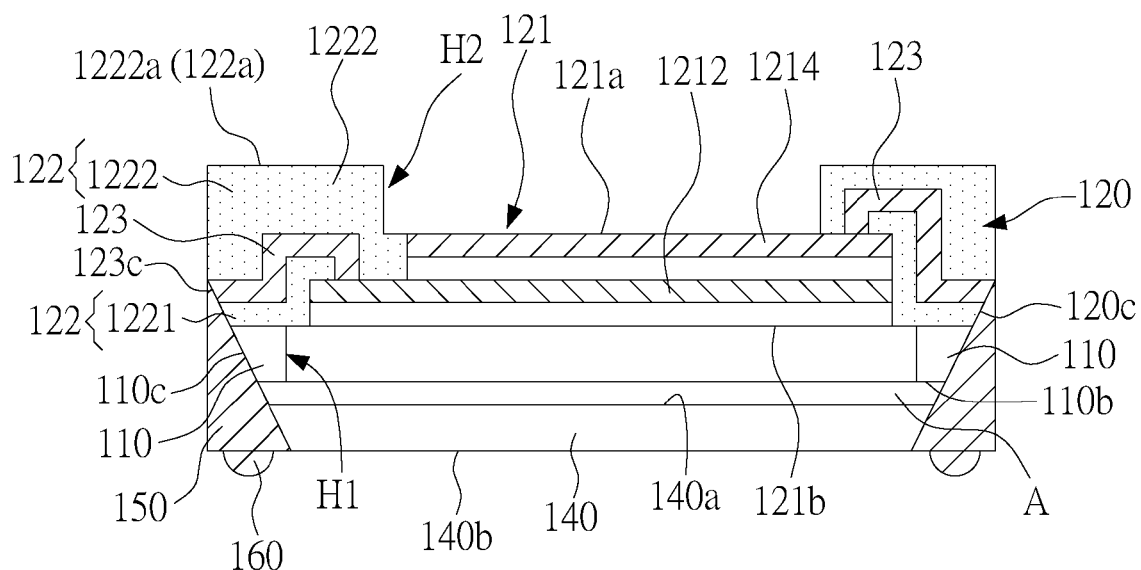

FIG. 3A to FIG. 3N are schematic diagrams formed at each step of a manufacturing method of a wafer level ultrasonic chip module according to an embodiment of the present invention respectively. Please refer to FIG. 3A to FIG. 3N in order.

Hereupon, a manufacturing method of the ultrasonic body 121 of FIG. 1 will be described as an example. First, as shown in FIG. 3A and FIG. 3B, the ultrasonic body 121 is formed on the upper surface 110a of the substrate 110, where the ultrasonic body 121 includes a first electrode 1212 and a second electrode 1214 not connected with the first electrode 1212. Referring to FIG. 1 and FIG. 3A, sequentially depositing a piezoelectric material to form a first piezoelectric material layer 1211', depositing a first electrode material to form a first electrode material layer 1212', depositing a piezoelectric material to form a second piezoelectric material layer 1213', and depositing a second electrode material to form a second electrode material layer 1214' on the substrate 110 by an evaporation method, a chemical vapor deposition (CVD) method, or a sputtering method. Then, as shown in FIG. 3B, the partial second electrode material layer 1214' and the second piezoelectric material layer 1213' may be removed through wet etching and dry etching processes to form a second electrode 1214 and a second piezoelectric layer 1213. The partial first electrode material layer 1212' and the first piezoelectric layer 1211' may be removed through the wet etching and dry etching processes to form a first electrode 1212 and a first piezoelectric layer 1211. The second piezoelectric layer 1213 and the second electrode 1214 are enabled to expose a partial upper surface 1212a of the first electrode 1212. Hereupon, the ultrasonic body 121 includes the first piezoelectric layer 1211, the first electrode 1212, the second piezoelectric layer 1213 and the second electrode 1214 which are sequentially stacked on the substrate 110. The second piezoelectric layer 1213 and the second electrode 1214 do not cover the partial upper surface 1212a of the first electrode 1212.

Then, an entire first protective material layer (not shown) is formed on the upper surface 121a of the ultrasonic body 121 and the upper surface 110a of the substrate 110 by a method such as spraying or sputtering. After that, as shown in FIG. 3C, the first protective material layer is patterned by a dry etching process to form a first protective layer 1221. The first protective layer 1221 has two circuit predetermined areas V1. The two circuit predetermined areas V1 respectively correspond to and expose the partial upper surface 1212a of the first electrode 1212 and a partial upper surface 1214a of the second electrode 1214. In an implementation, the material of the first protective layer 1221 is, for example but not limited to, silicon dioxide (PE-SiO$_2$).

As shown in FIG. 3D, a conductive material layer is formed on the two circuit predetermined areas V1 on the substrate 110 by an evaporation method, a chemical vapor deposition method or a sputtering method, so as to form two electrode circuits 123. Hereupon, in an implementation of this step, the two electrode circuits 123 may be formed by depositing a conductive material on an upper surface 1221a of the first protective layer 1221 and performing an etching process (such as wet etching). In an implementation, the materials of the two electrode circuits 123 may be copper aluminide (AlCu). In an implementation, circuits (not shown) may be formed on the conductive material layer according to the overall electrical connection requirement, that is, these circuits are formed by etching the conductive material layer located on the upper surface 1221a of the first protective layer 1221. These circuits may be used as circuits electrically connected between the ultrasonic body 121 and/or other electronic components, such as circuit wires and conductive pads.

As shown in FIG. 3E, a second protective layer 1222 is formed on the two electrode circuits 123 by a method such as spraying or sputtering, and the second protective layer 1222 exposes the partial electrode circuits 123. In an implementation, the second protective layer 1222 covers the upper surface 1221a of the first protective layer 1221 and the upper surface of the electrode circuit 123, and exposes the side surface 123c of the electrode circuit 123. In an implementation, the material of the second protective layer 1222 may be the same as the material of the first protective layer so as to form the protective layer 122. The protective layer 122 wraps the two electrode circuits 123 and exposes the partial electrode circuits 123. For example, the protective layer 122 exposes the side surfaces 123c of the two electrode circuits 123. In an implementation, the material of the second protective layer 1222 is, for example but not limited to, silicon dioxide ($PE-SiO_2$).

As shown in FIG. 3F, the lower surface 110b of the substrate 110 is ground to thin the substrate 110. This step is an optional step.

As shown in FIG. 3G, the partial second protective layer 1222 is removed from an upper surface 1222a (that is, the upper surface 122a of the protective layer 122) of the second protective layer 1222. The partial second protective layer 1222 is removed from an upper surface 1222a (that is, the upper surface 122a of the protective layer 122) of the second protective layer 1222 by dry etching to expose the partial upper surface 121a of the ultrasonic body 121, so as to form an opening H2. The opening H2 extends from the upper surface 122a of the protective layer 122 to the upper surface 121a of the ultrasonic body 121, and the partial upper surface 121a of the ultrasonic body 121 is exposed. In an implementation, as shown in FIG. 3G, the partial second protective layer 1222 may be further removed to expose the partial electrode circuits 123 such as the side surfaces 123c of the two electrode circuits 123.

As shown in FIG. 3H, a carrier plate D is covered to shield the upper surface 1222a of the second protective layer 1222 and the opening H2. Hereupon, the carrier plate D is used as a cover plate for protecting the opening H2. In addition, the carrier plate D may also be used as a carrying substrate to facilitate subsequent steps. In an implementation, a carrier plate D may be disposed on the upper surface 1222a of the second protective layer 1222 and the opening H2 through an adhesive material B. The carrier plate D may be, but is not limited to, a glass substrate and a silicon substrate.

As shown in FIG. 3I, the partial substrate 110 corresponding to the ultrasonic body 121 is removed from the lower surface 110b of the substrate 110 to the upper surface 110a of the substrate 110 by grinding or dry etching to expose the lower surface 121b of the ultrasonic body 121, so as to form a through slot H1.

As shown in FIG. 3J, a base material 140 is formed on the lower surface 110b of the substrate 110, such that a space H3 is formed among the through slot H1, the lower surface 121b of the ultrasonic body 121 and an upper surface 140a of the base material 140. In an implementation, the base material 140 may be adhered to the lower surface 110b of the substrate 110 through an adhesive material A. In an implementation, the adhesive material A may be a double-sided adhesive tape, viscous ink or viscous paint. In an implementation, the step of forming the base material 140 on the lower surface 110b of the substrate 110 may further include: evacuating the space H3 through an evacuating device to reduce the air pressure in the space H3 to form a vacuum space.

As shown in FIG. 3K, the two electrode circuits 123 and the substrate 110 are cut to expose the side surfaces 123c of the two electrode circuits 123 and the side surface 110c of the substrate 110.

As shown in FIG. 3L, a conductor layer 150 is formed on the side surface 120c of the composite layer 120 by sputtering, spraying or coating. In an implementation, the conductor layer 150 may be further formed from the side surface 120c of the composite layer 120 to the lower surface 140b of the base material 140. In an implementation, the conductor layer 150 is electrically connected with the side surfaces 123c of the two electrode circuits 123 that are exposed from the composite layer 120.

As shown in FIG. 3M, a pad 160 is formed on the conductor layer 150. Here, the two electrode circuits 123 may be electrically connected with the pad 160 by means of the conductor layer 150, so that components (such as the ultrasonic body 121 and/or other electronic components) may be electrically connected with external circuits. In an implementation, the pad 160 may be a solder ball or a bump, and may be formed by a solder ball implanting process such as electroplating or printing.

As shown in FIG. 3N, the carrier plate D is removed to expose the opening H2.

Referring again to FIG. 1, an ultrsonic conducting material 130 is filled in the opening H2. Hereupon, the ultrasonic conducting material 130 is located in the opening H2 and is in contact with the upper surface 121a of the ultrasonic body 121.

FIG. 4A to FIG. 4H are schematic diagrams formed at each step of a manufacturing method of a wafer level ultrasonic chip module according to another embodiment of the present invention respectively. Please refer to FIG. 4A to FIG. 4H in order.

Figure 4A:
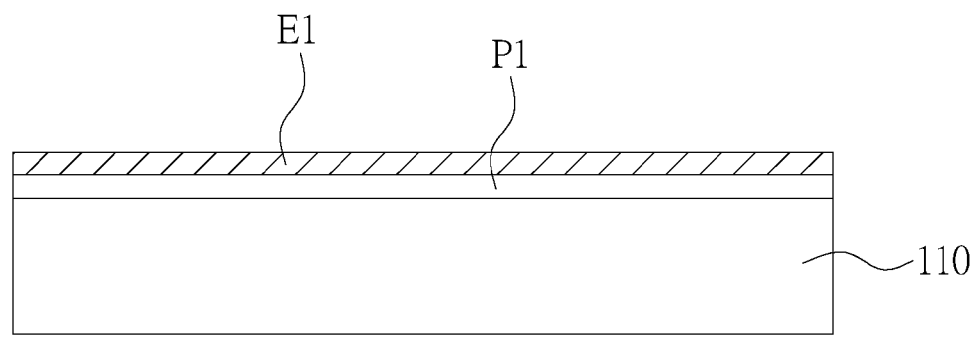
FIG. 4A to FIG. 4H are schematic diagrams formed at each step of a manufacturing method of a wafer level ultrasonic chip module according to another embodiment of the present invention respectively.

Hereupon, a manufacturing method of the ultrasonic body 221 of FIG. 2 will be described as an example. First, as shown in FIG. 4A, a piezoelectric material layer and an electrode material layer are sequentially formed on the substrate 110. A piezoelectric layer is deposited to form a piezoelectric material layer P1 and an electrode material is deposited to form an electrode material layer E1 on the substrate 110 sequentially by a method such as an evaporation method, a chemical vapor deposition method or a sputtering method.

Figure 4B:
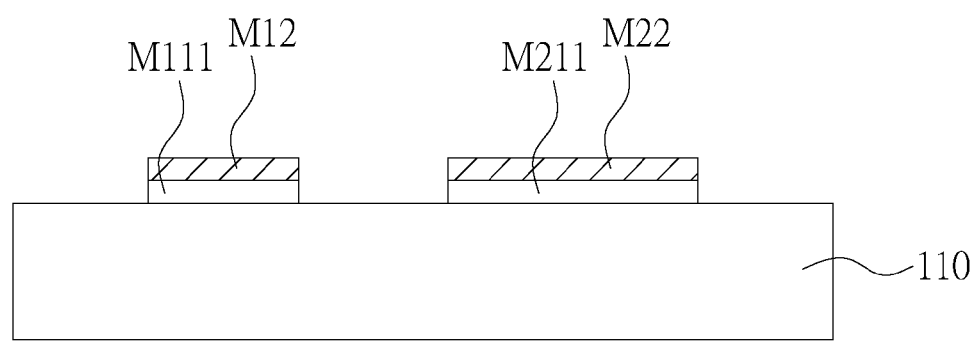

As shown in FIG. 4B, a partial electrode material layer E1 may be removed by a wet etching process to form a first electrode M12 and a second circuit M22 which are separated from each other. Then, a partial piezoelectric material layer P1 may be removed by a dry etching process to form a first bottom piezoelectric layer M111 and a second bottom piezoelectric layer M211 which are separated from each other.

Figure 4C:
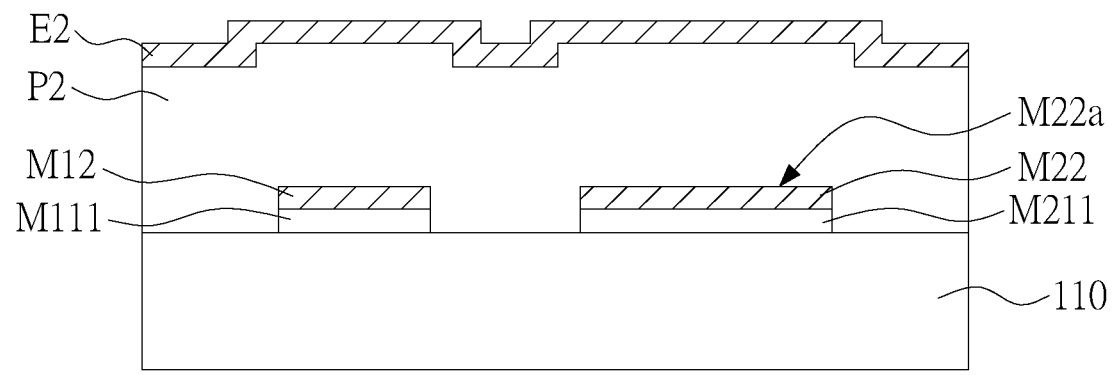

As shown in FIG. 4C, another piezoelectric material layer P2 and another electrode material layer E2 may be sequentially formed on an upper surface M12a of the first electrode M12 and an upper surface M22a of the second circuit M22 by an evaporation method, a chemical vapor deposition method, or a sputtering method.

Figure 4D:
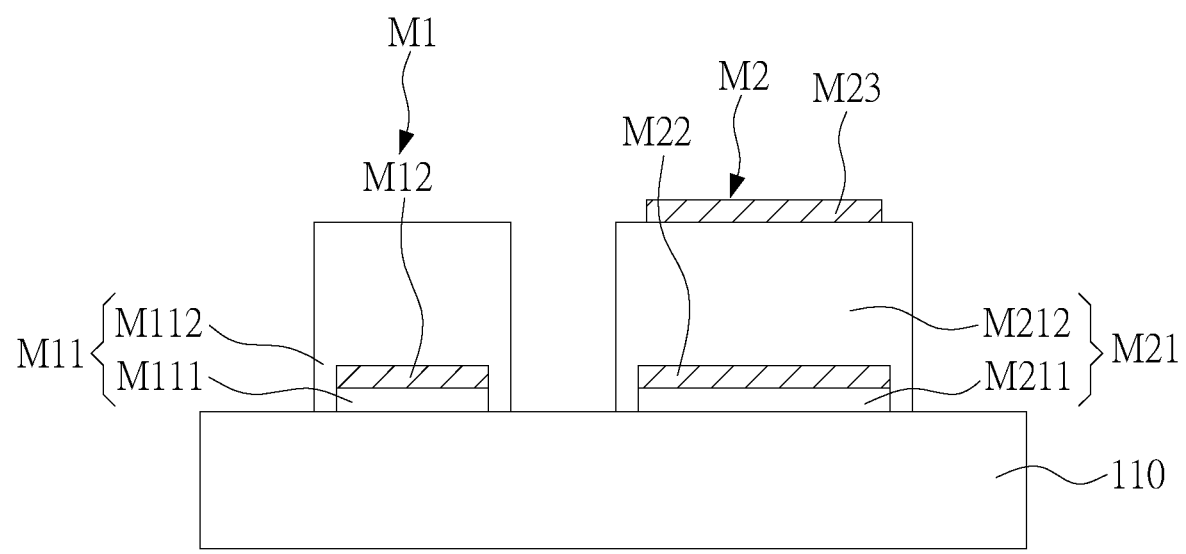

As shown in FIG. 4D, a partial electrode material layer E2 may be removed by the wet etching process to form a second electrode M23. Then, a partial piezoelectric material layer P2 may be removed by the dry etching process to form a first top piezoelectric layer M112 and a second top piezoelectric layer M212 which are separated from each other. Hereupon, a first ultrasonic component M1 and a second ultrasonic component M2 are formed on the substrate 110.

Figure 4E:
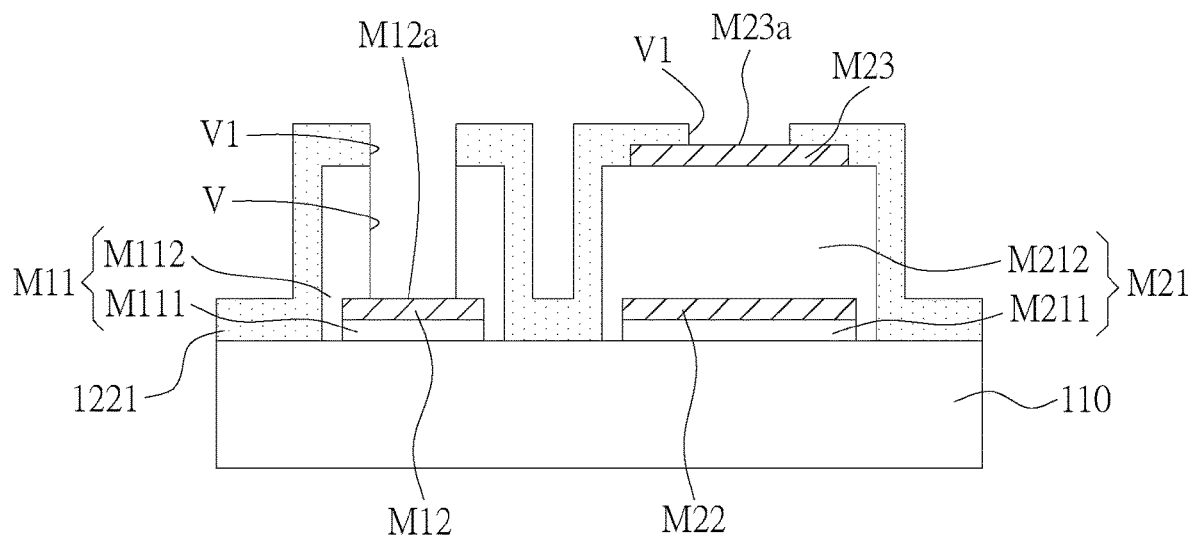

As shown in FIG. 4E, a first protective material layer (not shown) is formed on the upper surface 121a of the ultrasonic body 121 and the upper surface 110a of the substrate 110. After that, the first protective material layer is patterned by the dry etching process to form a first protective layer 1221. The first protective layer 1221 has two circuit predetermined areas V1. The two circuit predetermined areas V1 respectively correspond to and expose a partial upper surface M12a of the first electrode M12 and a partial upper surface M23a of the second electrode M23. Then, the first top piezoelectric layer M112 is etched by the wet etching process until the partial upper surface M12a of the first electrode M12 is exposed to form a contact hole V, where the contact hole V communicates with the circuit predetermined area V1 corresponding to the first electrode M12 to expose the partial upper surface M12a of the first electrode M12.

Figure 4F:
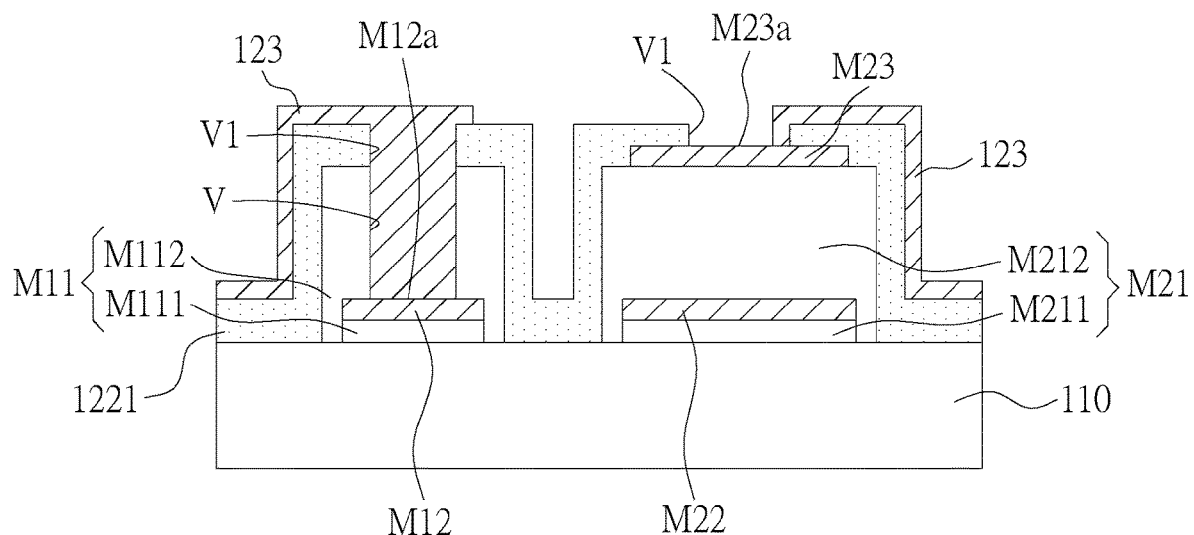

As shown in FIG. 4F, a conductive material layer is formed on the two circuit predetermined areas V1 and the contact hole V on the substrate 110 by an evaporation method, a chemical vapor deposition method or a sputtering method, so as to form two electrode circuits 123.

Figure 4G:
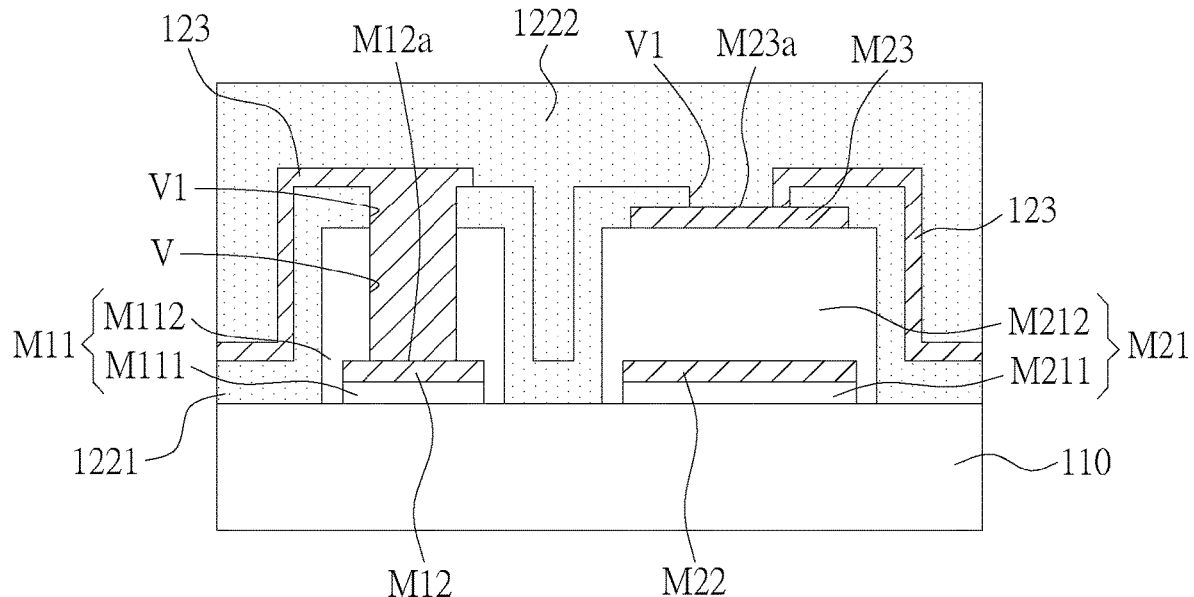

As shown in FIG. 4G, a second protective layer 1222 is formed on the two electrode circuits 123 by a method such as spraying or sputtering.

Figure 4H:
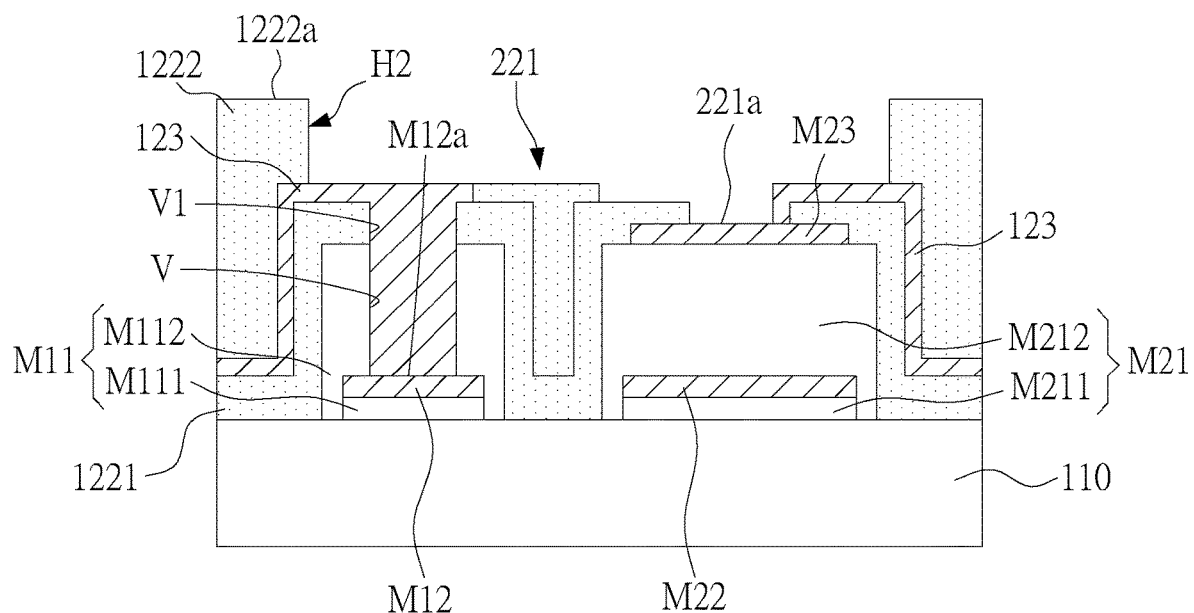

As shown in FIG. 4H, the partial second protective layer 1222 is removed from an upper surface 1222a (that is, the upper surface 122a of the protective layer 122) of the second protective layer 1222. The partial second protective layer 1222 is removed from an upper surface 1222a (that is, the upper surface 122a of the protective layer 122) of the second protective layer 1222 by dry etching to expose the partial upper surface 121a of the ultrasonic body 121, so as to form an opening H2. The opening H2 extends from the upper surface 122a of the protective layer 122 to the upper surface 221a of the ultrasonic body 221, and exposes the second electrode M23 and the upper surface 221a of the ultrasonic body 221. In an implementation, as shown in FIG. 4H, the opening H2 may further expose an electrode circuit 123 electrically connected to the first electrode M12 in addition to exposing the upper surface 221a of the ultrasonic body 221 and the second electrode M23. In another implementation (not shown), the opening H2 may expose only the second electrode M23 and the upper surface 221a of the ultrasonic body 221.

Next, the steps of FIG. 3H to FIG. 3N are successively performed. Since the steps are substantially the same as the foregoing, the difference is substantially only that the present embodiment is the ultrasonic body 221 of FIG. 2, and thus will not be described herein.

In an embodiment, the ultrasonic body (ultrasonic body 121 and 221) may transmit a sound message to be transmitted by using an ultrasonic signal as a carrier. The ultrasonic signal may give a sound notification to a specific area of the space.

In an embodiment, the ultrasonic signal generated by the ultrasonic body (ultrasonic body 121 and 221) may be reflected by peaks and valleys of a finger fingerprint, and the texture of the finger fingerprint can be recognized by the reflected ultrasonic signal. In addition, it can also be used for sensing the ultrasonic signal reflected by a palm to realize gesture recognition.

In an embodiment, the wafer level ultrasonic chip module 100 or 200 may be used as a distance sensor, a displacement sensor, a height sensor or a direction sensor. The ultrasonic signal generated by the ultrasonic body (ultrasonic body 121 and 221) is reflected by an object and may be used for measuring the distance, moving direction or displacement between a person and the wafer level ultrasonic chip module 100. Hereupon, the ultrasonic body (ultrasonic body 121 and 221) may sense a distance or a moving direction of an object or a human body approach to the wafer level ultrasonic chip module 100 or 200 to generate a distance signal or a direction signal. Hereupon, the ultrasonic body (ultrasonic body 121 and 221) can generate an ultrasonic signal for a specific object or human body according to the distance signal or the direction signal.

In an embodiment, the wafer level ultrasonic chip module 100 or 200 may be used as a pressure sensor, which is, for example but not limited to, a water pressure sensor, an air pressure sensor or an oil pressure sensor.

In an embodiment, the wafer level ultrasonic chip module 100 or 200 may be used as a flow meter. The ultrasonic signal generated by the ultrasonic body (ultrasonic body 121 and 221) is propagated at a specific angle with the flow direction of a fluid. The flow rate is measured by the change in the propagation time of the ultrasonic signal. When the propagation speed of the ultrasonic signal is low, it is indicated that the direction of the ultrasonic signal passing through the fluid is opposite to the flow direction of the fluid. When the propagation speed of the ultrasonic signal is high, it is indicated that the direction of the ultrasonic signal passing through the fluid is the same as the flow direction of the fluid.

In summary, an embodiment of the present invention provides a wafer level ultrasonic chip module and a manufacturing method thereof. An ultrasonic conducting material is disposed in an opening of a protective layer, and since an ultrasonic signal can be better transmitted to a finger by means of the ultrasonic conducting material, the accuracy of fingerprint recognition can be further improved.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A wafer level ultrasonic chip module, comprising:
a substrate comprising a through slot, the through slot passing through an upper surface of the substrate and a lower surface of the substrate;
a composite layer located on the substrate, the composite layer comprising an ultrasonic body and a protective layer, wherein the ultrasonic body is located on the upper surface of the substrate and a lower surface of the ultrasonic body is exposed from the through slot, the protective layer covers the ultrasonic body and a partial upper surface of the substrate, the protective layer has an opening, and the opening exposes a partial upper surface of the ultrasonic body, wherein the through slot and the opening are at two opposite sides of the ultrasonic body;
an ultrasonic conducting material located in the opening and being in contact with the upper surface of the ultrasonic body, wherein the ultrasonic conducting material is polydimethylsiloxane; and
a base material, located on the lower surface of the substrate and covering the through slot, such that a space is formed among the through slot, the lower surface of the ultrasonic body and an upper surface of the base material, wherein the space is vacuum.

2. The wafer level ultrasonic chip module according to claim 1, wherein the ultrasonic body comprises:
a first piezoelectric layer located on the substrate;
a first electrode located on the first piezoelectric layer;
a second piezoelectric layer located on the first electrode; and
a second electrode located on the second piezoelectric layer, wherein the second piezoelectric layer and the second electrode do not cover a partial upper surface of the first electrode.

3. The wafer level ultrasonic chip module according to claim 1, wherein the ultrasonic body comprises:
a first ultrasonic component, comprising:
a first piezoelectric layer located on the substrate, the first piezoelectric layer having a contact hole; and
a first electrode being wrapped in the first piezoelectric layer, the contact hole exposing a partial upper surface of the first electrode; and
a second ultrasonic component, wherein the second ultrasonic component and the first ultrasonic component do not overlap in a direction perpendicular to the substrate, the second ultrasonic component comprising:
a second piezoelectric layer located on the substrate, the second piezoelectric layer and the first piezoelectric layer being at the same layer but separated from each other;
a second circuit being wrapped in the second piezoelectric layer, the second circuit and the first electrode being at the same layer but separated from each other; and
a second electrode located on the second piezoelectric layer, wherein the opening at least exposes the second electrode, and the conducting material is in contact with an upper surface of the second electrode.

4. The wafer level ultrasonic chip module according to claim 2, wherein the composite layer further comprises two electrode circuits, the protective layer wraps the two electrode circuits, the two electrode circuits are located on the partial upper surface of the first electrode and a partial upper surface of the second electrode respectively, and the two electrode circuits are electrically connected with the first electrode and the second electrode respectively.

5. The wafer level ultrasonic chip module according to claim 3, wherein the composite layer further comprises two electrode circuits, the protective layer wraps the two electrode circuits, the two electrode circuits are located on the partial upper surface of the first electrode and a partial upper surface of the second electrode respectively, and the two electrode circuits are electrically connected with the first electrode and the second electrode respectively.

6. The wafer level ultrasonic chip module according to claim 5, further comprising a conductor layer and at least one pad, wherein the conductor layer is located from a side surface of the composite layer to a lower surface of the base material, the conductor layer is electrically connected with the two electrode circuits, and the at least one pad is located on the conductor layer.

7. The wafer level ultrasonic chip module according to claim 4, further comprising a conductor layer and at least one pad, wherein the conductor layer is located from a side surface of the composite layer to a lower surface of the base material, the conductor layer is electrically connected with the two electrode circuits, and the at least one pad is located on the conductor layer.

* * * * *